(12) United States Patent
Uehara

(10) Patent No.: US 6,802,120 B2
(45) Date of Patent: Oct. 12, 2004

(54) METHOD OF MANUFACTURING A PRINTED WIRING BOARD HAVING A NON-THROUGH MOUNTING HOLE

(75) Inventor: Toshiki Uehara, Tokyo (JP)

(73) Assignee: Nippon Avionics Co., Ltd., Tokyo (JP)

(*) Notice: Subject to any disclaimer, the term of this patent is extended or adjusted under 35 U.S.C. 154(b) by 83 days.

(21) Appl. No.: 10/191,986

(22) Filed: Jul. 10, 2002

(65) Prior Publication Data
US 2003/0012004 A1 Jan. 16, 2003

(30) Foreign Application Priority Data
Jul. 10, 2001 (JP) ........................................ 2001-208967

(51) Int. Cl.$^7$ .............................................. H05K 3/10
(52) U.S. Cl. .............................. 29/852; 29/831; 29/846; 29/847; 29/DIG. 16; 216/13; 216/17; 427/96; 427/97; 174/255; 174/261; 361/736
(58) Field of Search ........................... 29/829–831, 846, 29/847, 852, DIG. 16; 216/13, 17; 427/96, 97; 174/255, 256, 261, 265; 361/736, 739, 748

(56) References Cited

U.S. PATENT DOCUMENTS 5,258,094 A * 11/1993 Furui et al. ............... 29/852 X

FOREIGN PATENT DOCUMENTS

| JP | 2-153594 | * 6/1990 | ............... 29/830 |
| JP | 2-251195 | * 10/1990 | ............... 216/17 X |
| JP | 10-51093 | 2/1998 | |

\* cited by examiner

Primary Examiner—A. Dexter Tugbang
(74) Attorney, Agent, or Firm—Sughrue Mion, PLLC

(57) ABSTRACT

A method of manufacturing a printed wiring board, enabling insertion components to be mounted on both sides thereof, including: a) providing first and second copper-clad laminates, including plated through-holes thereon; b) hot-pressing the laminates with each other and a first prepreg bonding sheet therebetween, so that the through-holes are closed by the prepreg to form non-through holes; c) laminating a second prepreg on each of the surfaces of the composite laminate; d) covering the opening of respective non-through holes with a heat resistant resin film; e) laminating one-side copper-clad laminate on each of the surfaces of the product of (d), with the copper side out, followed by hot-pressing; f) etching the copper sides to form outer layer circuit patterns; g) removing the base material layers covering the openings of the non-through holes; and h) removing the heat resistant resin films of the openings of the non-through holes.

3 Claims, 13 Drawing Sheets

METHOD OF MANUFACTURING A PRINTED WIRING BOARD HAVING A NON-THROUGH MOUNTING HOLE

FIELD OF THE INVENTION

The present invention relates to a printed wiring board enabling insertion components having leads to be mounted on both front and back surfaces, and its manufacturing method. More particularly, the invention relates to a printed wiring board having a non-through lead mounting hole on both surfaces, and its manufacturing method.

BACKGROUND OF THE INVENTION

In the course of the development of the technology, reductions in size, weight and thickness of electronic equipment have associatively brought about progresses in high density mounting technology. For example, in mounting of components on a printed wiring board, in place of a component mounting method of obtaining electrical and mechanical coupling by inserting a lead into a through-hole, a surface mounting method of soldering a component electrode on a pad formed on a plane of the printed wiring board has mostly been used.

The surface mounting method is effective high density mounting means because of its capability of mounting surface mounted components not only on one surface but also both front and back surfaces of the printed wiring board. On the other hand, regarding a component mounted by inserting a component lead into the through-hole of the printed wiring board (referred to as inserting component having a lead, hereinafter), not only its component main body occupies a mounting surface area, but also it is impossible to mount the component on the back surface of the same position where the component lead penetrates from the front surface to the back surface. Further, a land formed in an outer edge of the through-hole limits disposition of an outer layer circuit pattern of the back surface for lead mounting.

Therefore, components still keeping insertion component shapes have mostly been limited to those, in which a great force is possibly applied to a joined portion with the printed wiring board. A component having a very large mass of a component main body, a connector or the like is an example of such components. It is because the surface mounted component pad formed on the plane of the printed wiring board is considerably lower in peel strength compared with the through-hole.

Regarding the method of mounting the inserting component having a lead on the printed wiring board, there are two methods. In one method, the component lead is inserted into the through-hole and then soldered. The other method is so-called press fitting method, in which a component with leads having elasticity in an axial radial direction is used, and electrical and mechanical connection is obtained by pressing the leads into a through-hole. As soldering is not necessary, this method has generally been used widely as a press-fitting connector on a large printed wiring board, especially in the case of a mother board or the like including a number of connectors disposed on a full surface of the printed wiring board.

Still, however, many of the connectors have large sizes while other mounted components are miniaturized. Further, the number of leads is large because of functionality, and lead pitches are narrow in most cases. Thus, constraints inevitable on pattern disposition and component mounting on the back surface of the printed wiring board are also very large.

However, the above constraints on the pattern disposition and the component mounting on the back surface can be partially reduced by using a recently disclosed technology, for example a plated non-through hole disclosed in Unexamined Japanese Patent Publication (KOKAI) No. 10-51093. A method of manufacturing a plated non-through hole by this prior art will be described by referring to schematic sectional views of FIGS. 10A to 10F.

In FIG. 10A, a reference numeral 101 denotes a double-sided or multilayer copper-clad laminate. First, a through-hole 102 is bored in the copper-clad laminate 101 by a drill. Then, first copper plating is carried out to form a through-hole plated layer 103 (FIG. 10B). Further, the through-hole 102 is filled with a resin 104 inside, and a surface of the resin is finished to be smooth after drying and curing (FIG. 10C).

Then, second copper plating is carried out to form a second plated layer 105 (FIG. 10D). Further, etching is carried out so as to achieve a predetermined surface outer layer conductor, forming a circuit pattern 106 and a land 107 (FIG. 10E). At this time, a surface component mounting pad 108 or a circuit pattern can be disposed on a behind side of a plated non-through hole.

Lastly, the resin 104 is removed by chemical solution or laser processing to form a non-through hole 109 (FIG. 10F). By using the non-through hole thus formed, as shown in FIG. 11, an insertion component 110 having a lead can be disposed on an opening side of the non-through hole, and the connection pad 108 of a surface mounted component 111 or a pattern can be disposed on an opposite side on the same position of a grid pattern.

However, in the foregoing conventional technology, it is only a surface mounted component or a pattern that can be disposed on the back surface of the insertion component having a lead, which is mounted on the printed wiring board. Thus, this technology cannot be a sufficient method for increasing a density in component mounting. In other words, if a similar insertion component having a lead can be oppositely mounted on the back surface of the insertion component having a lead, an enormous advantage can be expected.

For example, if connectors having insertion leads can be mounted on both front and back surfaces in the same position on the printed wiring board, an area necessary for the mounting can reduced to one half.

Further, in a large information processor for processing a great amount of information at a high speed, to increase a mounting density of the processor, as shown in FIG. 12, mother boards 201A and 201B have conventionally been disposed in the processor 210, and daughter boards 202 have been mounted from both front and back sides of the processor 210. However, electrical connection between the mother boards 201A and 201B has been made by a plurality of cables 203.

In recent high-speed digital transmission, however, an excessive length of a transmission path from end to end of two mother boards has caused delay of an electric signal or crosstalk between transmission lines, which has been a great obstacle to sufficient performance and reliability.

Thus, as shown in FIG. 13, if one mother board 204 is disposed on the center, and connectors are mounted to connect the daughter boards 202 to both sides thereof, a mounting density can be increased, and a transmission path can also be shortened greatly.

In this case, the front and back connectors may be shifted in position on the mother board, and connectors of through-leads may be alternately disposed. By this method, however, a number of through-holes make it difficult to draw around a pattern on all the layers and thus high-density mounting cannot be achieved.

Regarding processing of the printed wiring board, in the foregoing conventional processing method, a complex manufacturing process must be carried out, which includes drying and curing of the resin having filled the through-hole, polishing the surface to be smooth, further plating and etching, and then entirely removing of the resin supplied and cured in the previous step.

In addition, it is technically difficult to remove the resin having filled the non-through hole without any residuals. This difficulty combines with the complex manufacturing process to cause a reduction in printed wiring board yield, i.e., an increase in costs.

SUMMARY OF THE INVENTION

The present invention was made to solve the foregoing problems, and it is a first object of the invention to provide a printed wiring board having no-through lead mounting holes, which enables insertion component having leads to be mounted on both front and back surfaces of the printed wiring board, a mounting density to be increased, freedom of circuit design to be increased, and a transmission path to be shortened.

It is a second object of the invention to provide a method for manufacturing the printed wiring board having non-through lead mounting holes, which is simple, and low in defective rate, and capable of reducing costs.

The first object of the present invention is attained by a printed wiring board enabling insertion components having leads to be mounted on both upper and lower surfaces thereof, comprising:

first and second copper-clad laminates, circuit patterns being formed on the upper surface of the first laminate and lower surface of the second laminate, respectively;

an insulation layer provided between said first and second laminates; a first non-through hole formed on the upper surface of said first laminate, a bottom of the first non-through hole being closed by said insulation layer; and a second non-through hole formed on the lower surface of said second laminate, a top end of the second non-through hole being closed by said insulation layer;

wherein inner wall surfaces of said first and second non-through holes are conductive and the insertion components can be mounted on the first and second non-through hole.

The first and second non-through holes may be disposed in a manner that the insertion components mounted on the front and back surfaces are overlapped with each other at least partially when seen from a direction vertical to the printed wiring board. With such arrangement, limitations for deciding component mounting positions on the front and back surface are reduced, thus increasing freedom of circuit design. The non-through holes opened on the front and back sides may be positioned at least partially on the same grid, i.e., the same coordinate position of the grid pattern of the printed wiring board. In this case, mounting densities on the front and back sides can be further increased. If the front and back components having leads are mounted as identical components on non-through holes on the same grid of both front and back surfaces, the components can be mounted on identical places of both front and back surfaces, further increasing mounting densities.

The second object of the present invention is attained by a method of manufacturing a printed wiring board enabling insertion components having leads to be mounted on both upper and lower sides thereof, comprising the steps of:

a) providing first and second copper-clad laminates which will make the upper and lower sides of the printed wiring board, respectively, and which are provided with plated through-holes thereon, respectively;

b) filling the through-hole of the respective laminates with a conductive paste;

c) curing the respective conductive pastes to be hardened;

d) hot-pressing the first and second laminates with each other with a prepreg as a bonding sheet being sandwiched therebetween to form a composite laminate; and e) boring a hole in the respective conductive pastes filled in the through-holes of the respective laminates to form a non-through hole which does not penetrate to the prepreg in the composite laminate, so that the non-through holes can be used for lead mounting of the insertion components from both upper and lower side of the printed wiring board.

The prepreg is a reinforced resin made by impregnating with thermosetting or thermoplastic resin, a fiber matrix such as glass cloth, aramide paper or the like, and also serves as an electrical insulation layer in the resultant printed wiring board.

The second object of the present invention is also attained by a manufacturing method of a printed wiring board, comprising the steps of:

a) providing first and second copper-clad laminates which will make the upper and lower sides of the printed wiring board, respectively, and which is provided with a plated through-hole thereon, respectively;

b) forming a resist on the respective laminates in an area other than the plated through-hole and a land thereof;

c) plating on an area on which the resist is not formed, then removing the resist so as to form a thick copper plated layer on an inner wall surface of the respective through-holes;

d) hot-pressing said first and second laminates with each other with a prepreg as a bonding sheet being sandwiched therebetween to form a composite laminate; and e) boring a hole on a resin component of the prepreg, which has filled in the respective non-through holes due to a pressure of the hot-press in the step c), with scraping of the respective copper plated layers, to form a non-through hole having the copper plated layer disposed on an inner surface wall thereof, so that the non-through holes can be used for lead mounting of the insertion components from both upper and lower side of the printed wiring board.

Another manufacturing method of a printed wiring board according to the present invention comprises the steps of:

a) providing first and second copper-clad laminates which will make the upper and lower sides of the printed wiring board, respectively, and which is provided with a plated through-hole thereon, respectively;

b) forming a resist on the respective laminates in an area other than the plated through-hole and a land thereof;

c) plating on an area on which the resist is not formed, then removing the resist so as to form a thick copper plated layer on an inner wall surface of the respective through-holes;

d) hot-pressing said first and second laminates with each other with a prepreg as a bonding sheet being sandwiched therebetween to form a composite laminate; and e) boring a hole on a resin component of the prepreg, which has filled in the respective non-through holes due to a pressure of the hot-press in the step c), with scraping of the respective copper plated layers, to form a non-through hole having the copper plated layer disposed on an inner surface wall thereof, so that the non-through holes can be used for lead mounting of the insertion components from both upper and lower side of the printed wiring board Another method of manufacturing a printed wiring board according to the present invention comprises the steps of:

a) providing first and second copper-clad laminates which will make the upper and lower sides of the printed wiring board, respectively, and which is provided with a plated through-hole thereon, respectively;

b) hot-pressing said first and second laminates with each other with a prepreg as a bonding sheet being sandwiched therebetween to form a composite laminate; a resin component of the prepreg having low flowability so that the respective through-holes is closed by the prepreg to form a non-through hole;

c) laminating resin films each having a copper foil layer thereon on upper and lower surfaces of said composite laminate while setting the respective copper foil layers outside;

d) forming an outer layer circuit pattern on the respective copper foil layers by etching processing; and.

e) removing the resin films remaining on an opening of the non-through hole by laser beam, so that the non-through holes can be used for lead mounting of the insertion components from both upper and lower side of the printed wiring board.

Yet another method of manufacturing a printed wiring board according to the present invention comprises the steps of:

a) providing first and second copper-clad laminates which will make the upper and lower sides of the printed wiring board, respectively, and which is provided with a plated through-hole thereon, respectively;

b) hot-pressing said first and second laminates with each other with a first prepreg as a bonding sheet being sandwiched therebetween to form a composite laminate; a resin component of the first prepreg having low flowability so that the respective through-holes is closed by the prepreg to form a non-through hole;

c) laminating a second prepreg, a resin component of which has low flowability, on each of upper and lower surfaces of said composite laminate, the second prepreg having an opening corresponding an opening of the non-through hole;

d) covering the opening of the respective non-through holes exposed on the upper and lower surfaces of said composite laminate with a heat resistant resin films;

e) laminating one-side copper-clad laminate, which has a base material layer and a copper layer thereon, on each of the upper and lower surfaces of the product of step d) while disposing the copper layer outside, followed by hot-pressing;

f) etching the one-side copper-clad laminates to form outer layer circuit patterns, and to remove the copper layers positioned on the openings of the non-through holes to expose the base material layers;

g) removing the base material layers covering the openings of the non-through holes by end mill processing, to expose the heat resistant resin film outside; and h) removing the heat resistant resin films from the openings of the non-through holes, so that the non-through holes can be used for lead mounting of the insertion components from both upper and lower side of the printed wiring board.

According to the present invention, the non-through holes opened on both front (or upper) and back (or back) surfaces of the printed wiring board can be formed, and the insertion components can be mounted on optional positions of the printed wiring board from both front and back sides. Therefore, it is possible to secure a high mounting density while obtaining joining strength, which has been impossible by the planar pad for joining the surface mounted components to the printed wiring board.

DESCRIPTION OF THE PREFERRED EMBODIMENTS

First Embodiment

Description will be made of a method of manufacturing a printed wiring board having a non-through hole according to a first embodiment of the present invention with references to FIGS. 2A to 2E, and FIG. 6.

Figure 2A:
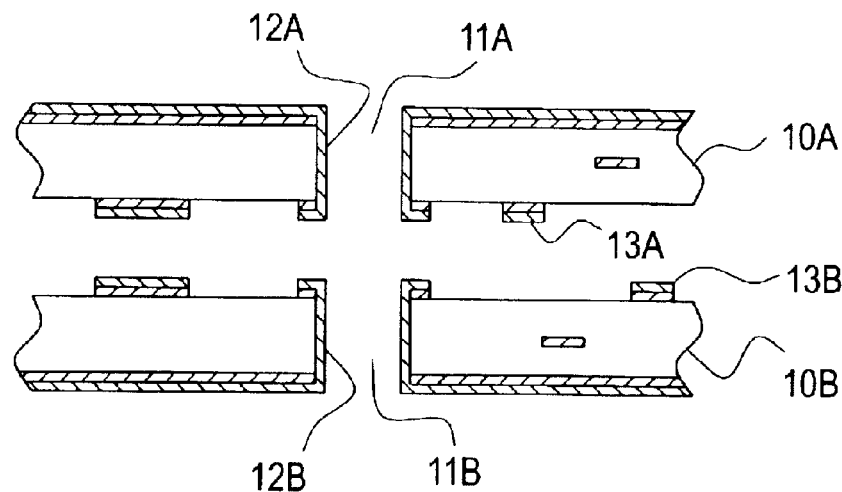
FIGS. 2A to 2E are schematic sectional views, each showing a manufacturing process of a printed wiring board according to a first embodiment of the present invention.

As shown in FIG. 2A, double-sided or multilayer copper-clad laminates 10A and 10B are provided, and through-holes 11A and 11B are bored on the same grid thereof. In other words, when the upper laminate 10A is laminated on or integrated with the lower laminate 10B as seen in FIGS. 2C–2E, the through-hole 11A of the upper laminate 10A will be located directly above the through-hole 11B of the lower laminate 10B. A through-hole diameter is set slightly larger (e.g., φ0.8 mm) than a target non-through hole diameter which corresponds to an outer diameter of the lead of the mounting component. Plated layers 12A and 12B are formed on inner wall surfaces of the through-holes 11Am 11B and lands thereof by copper plating. On surfaces opposite the laminates 10A and 10B, etching resist films having predetermined circuit pattern is applied, and then etching is carried out to form circuit patterns 13A and 13B of the inner layer conductors.

Figure 2B:
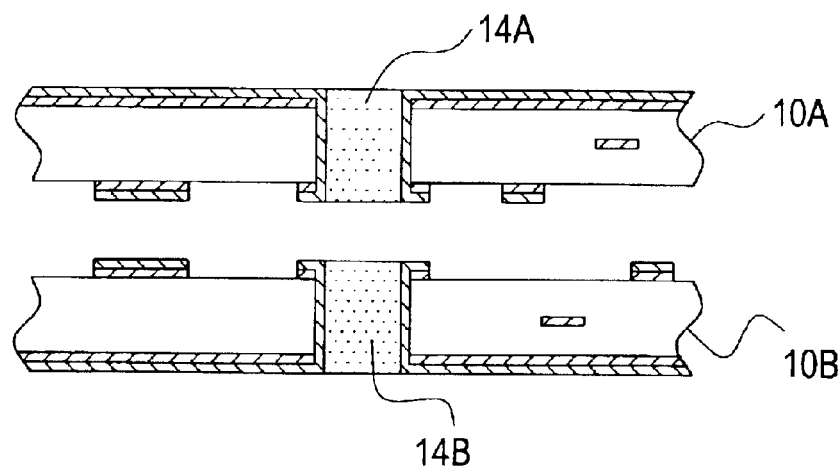
Figure 2C:
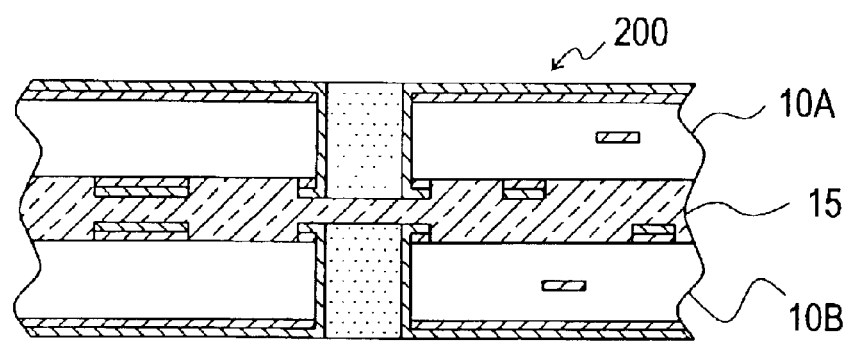
Figure 2D:
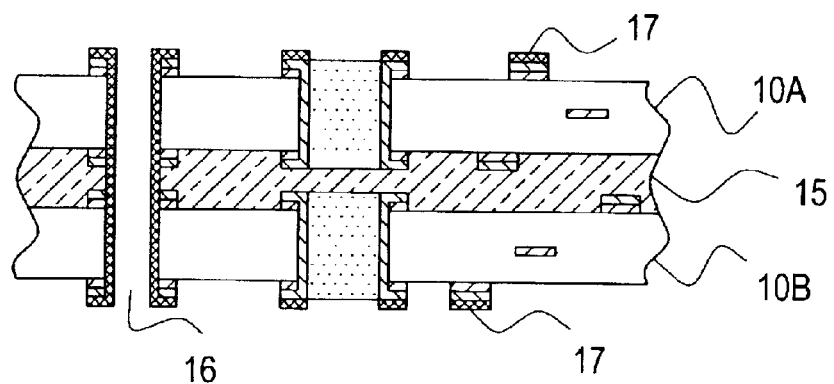
Figure 2E:
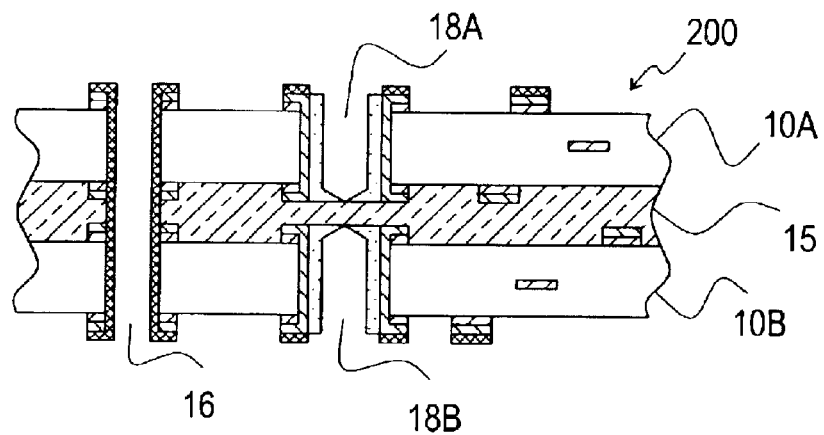

As shown in FIG. 2B, the through-holes 11A and 11B are respectively filled with conductive pastes 14A and 14B, and these pastes are cured to be hardened. Then, the two copper-clad laminates 10A and 10B are laminated and hot-pressed with a prepreg 15 as a bonding sheet to form a composite laminate 200 (FIG. 2C). In this state, the conductor patterns 13A and 13B become inner layer conductors. The prepreg 15 serves as an insulation layer in the composite laminate 200. Then, as shown in FIG. 2D, a through-hole 16 is bored to penetrate both of the laminates 10A and 10B, and an inner surface of this through-hole is plated with copper. Then, an etching resist film is formed to provide predetermined surface outer layer conductors, and circuit patterns 17 and 17 of the outer layer conductors are formed by carrying out etching. The through-hole 16 is designed to make the outer layer conductors 17 and 17 conductive to each other.

Holes are drilled up to just before the prepreg 15 on the through-holes 11A and 11B filled with the conductive pastes 14A and 14B to form non-through hole 18A and 18B for lead mounting. Each of the holes has an original finishing diameter (e.g., φ0.5 mm) and has the solidified conductive paste layer remained in the inner wall surface (FIG. 2E). Accordingly, the composite laminate 200 having non-through holes 18A and 18B can be used as the target wiring board for lead mounting from both sides thereof.

Figure 1:
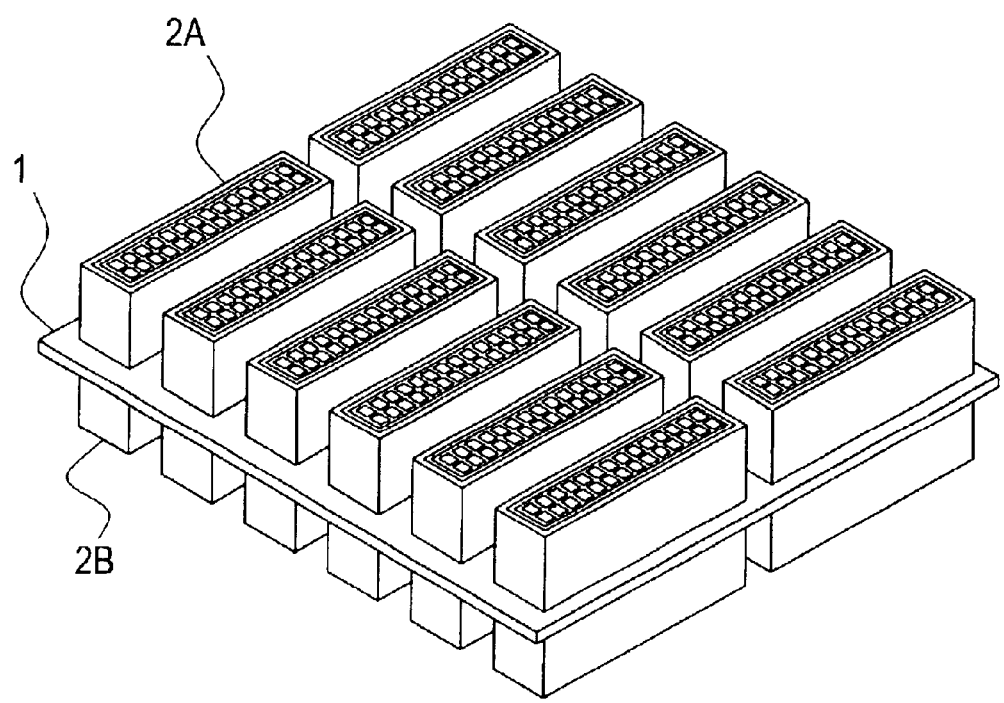
FIG. 1 is a perspective view showing a component mounting mode of a printed wiring board according to a generic embodiment of the present invention.
Figure 6:
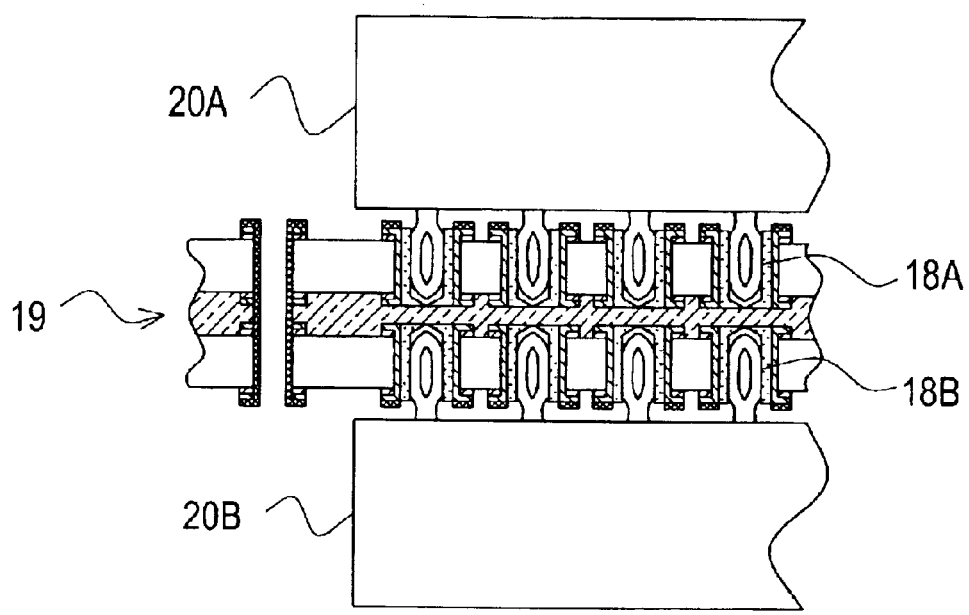
FIG. 6 is a schematic sectional view showing a component mounting mode of the printed wiring board according to the first embodiment of the invention.

FIG. 6 shows a mode of components mounted on the printed wiring board having the non-through holes formed according to the embodiment. In FIG. 6, a reference numeral 19 denotes a printed wiring board, and 20A and 20B press-fitting connectors. The press-fitting connectors 20A and 20B are connected to the printed wiring board 19 by press-fitting their leads into the non-through holes 18A and 18B. FIG. 1 shows a mode of a plurality of components 2A and 2B mounted at a high density on the front and back surfaces of the printed wiring board 1.

Second Embodiment

Figure 3A:
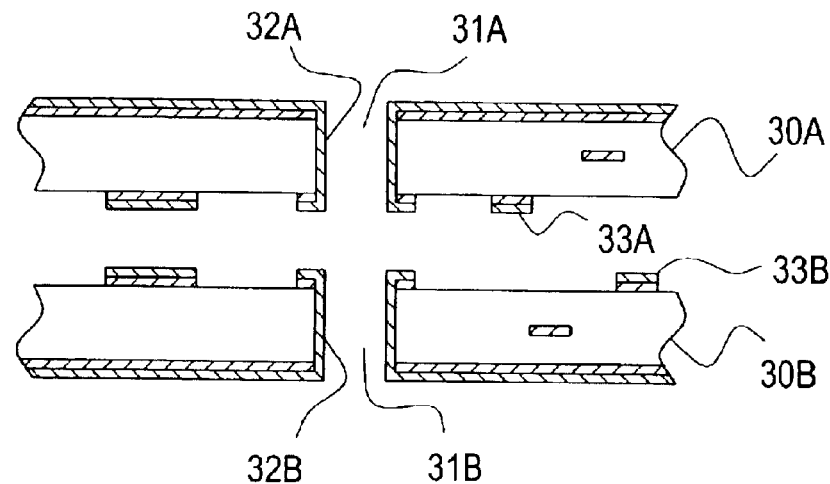
FIGS. 3A to 3E are schematic sectional views, each showing a manufacturing process of a printed wiring board according to a second embodiment of the present invention.

A manufacturing method of a printed wiring board having a non-through hole according to a second embodiment of the present invention with references to FIGS. 3A to 3E, and FIG. 7. As shown in FIG. 3A, double-sided or multilayer copper-clad laminates 30A and 30B are provided, and through-holes 31A and 31B are bored on the same grid thereof. A through-hole diameter is set slightly larger (e.g., φ0.8 mm) than a target non-through hole diameter which corresponds to an outer diameter of the lead of the mounting component. Plated layers 32A and 32B are formed on inner wall surfaces of the through-holes 31A and 31B by copper plating. On surfaces opposite the laminates 30A and 30B, etching resist films are coated to form predetermined inner layer conductor patterns, and then etching is carried out to form circuit patterns 33A and 33B of the inner layer conductors.

Figure 3B:
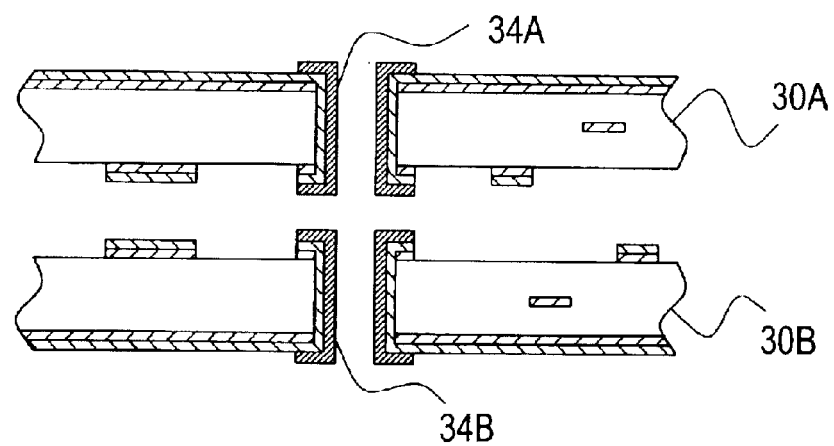

Then, areas other than the through-hole plated portions 32A, 32B and land portions thereof are covered with not-shown resist, the plated exposed portions 32A, 32B are plated copper to form thick copper-plated layers 34A and 34B, and the resist is remove (FIG. 3B). Here, a finishing diameter of each of the plated through-holes 31A and 31B having the thick copper-plated layers 34A and 34B is set slightly smaller (e.g., φ0.4 mm) than a target non-through hole diameter.

Figure 3C:
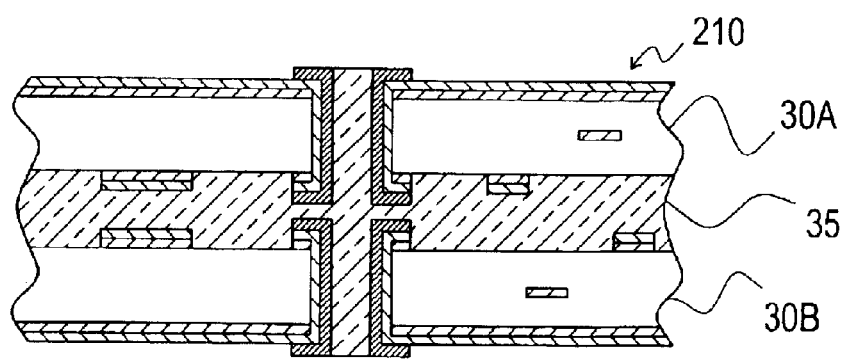
Figure 3D:
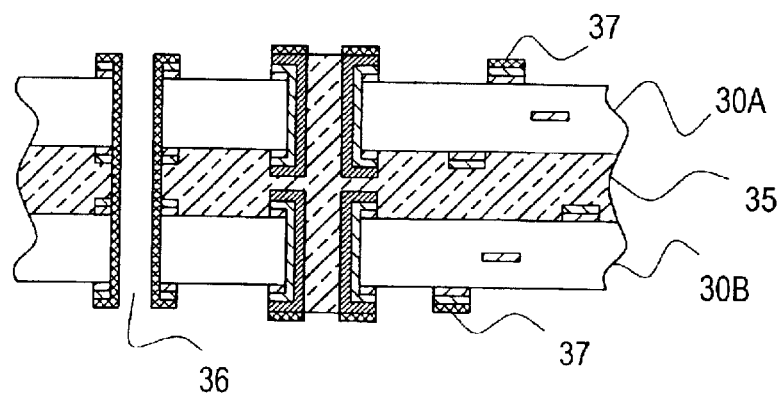

Then, the two copper-clad laminates 30A and 30B are laminated with a prepreg 35 as an insulating adhesive layer, followed by hot-pressing to form a composite laminate 210 (FIG. 3C). At the hot-pressing process, a resin component of the prepreg 35 fills the insides of the through-holes 31A and 31B. As shown in FIG. 3D, a through-hole 36 is bored to penetrate both of the laminates 30A and 30B, and an inner surface of this through-hole is plated with copper. Along this plating processing, an upper surface of the upper laminate 30A and an undersurface of the lower laminate 30B are also plated with copper. Then, an etching resist film having predetermined circuit pattern is coated on the both surfaces of the composite laminate 210, and circuit patterns 37 and 37 of the outer layer conductors are formed by carrying out etching. The through-hole 36 is designed to make the outer layer conductors 37 and 37 conductive to each other.

Figure 3E:
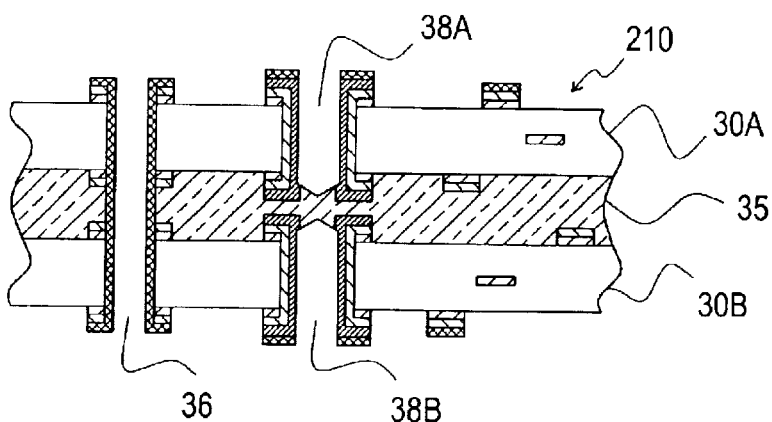

Lastly, holes are drilled on the plated through-holes 31A and 31B filled with the resin component of the prepreg 15 (FIG. 3E). The hole diameter is, for example, 0.5 mm, which is the target non-through hole diameter and sightly larger than the diameter, φ0.4 mm, of the thick copper-plated layers 34A, 34B. Therefore, the surface of the thick copper-plated layers 34A, 34B are slightly scraped so that the non-through hole 38A, 38B have conductive inner wall surfaces. An exemplary depth of the respective non-through holes 38A, 38B is equal to a thickness of the respective laminates 30A and 30B.

Figure 7:
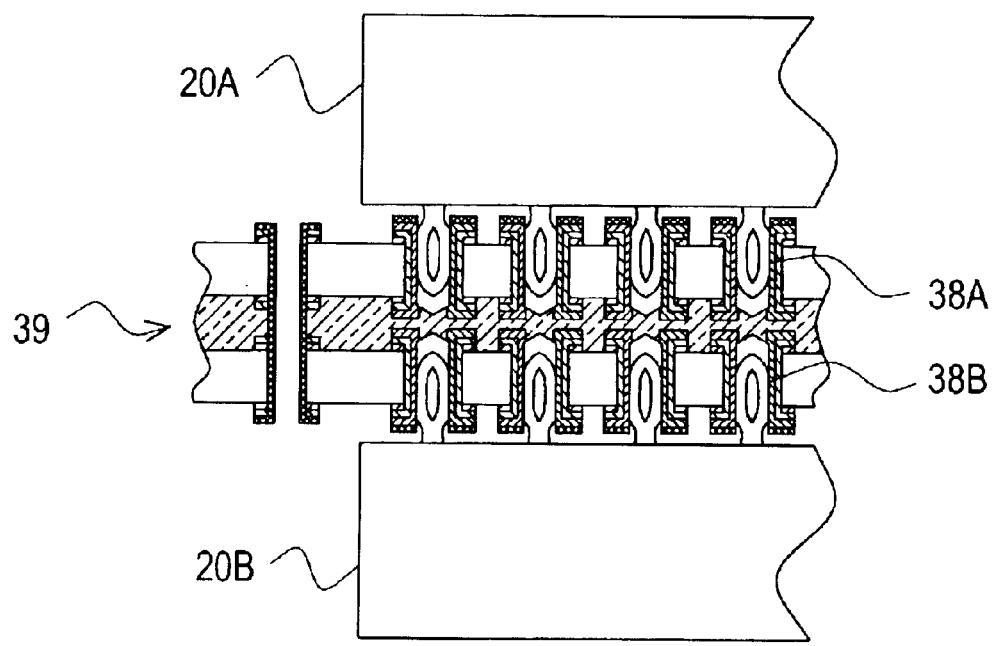
FIG. 7 is a schematic sectional view showing a component mounting mode of the printed wiring board according to the second embodiment of the invention.

FIG. 7 shows a mode of components mounted on the printed wiring board having the non-through holes formed according to the embodiment. In FIG. 7, a reference numeral 39 denotes a printed wiring board, and 20A and 20B press-fitting connectors. The press-fitting connectors 20A and 20B are connected to the wiring board 29 by press-fitting their leads into the non-through holes 38A and 38B.

Third Embodiment

A third embodiment of manufacturing method of a printed wiring board will be described hereinafter with references to FIGS. 4A to 4E, and FIG. 8.

Figure 4A:
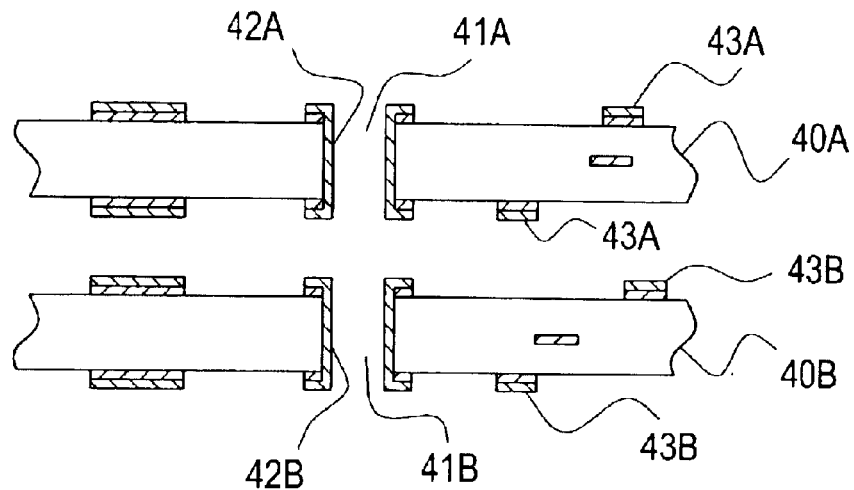
FIGS. 4A to 4E are schematic sectional views, each showing a manufacturing process of a printed wiring board according to a third embodiment of the present invention.

As shown in FIG. 4A, double-sided or multilayer copper-clad laminates 40A and 40B are provided, and through-holes 41A and 41B are bored on the same grid thereof. A through-hole diameter is set equal to a diameter (e.g., φ0.5 mm) of a target non-through hole.

Plated layers 42A and 42B are formed on inner wall surfaces of the through-holes 41A and 41B by copper plating. On both upper and lower surfaces of the laminates 40A and 40B, etching resist films having predetermined circuit pattern are applied, then etching is carried out to form circuit patterns 43A and 43B of the inner layer conductors.

Figure 4B:
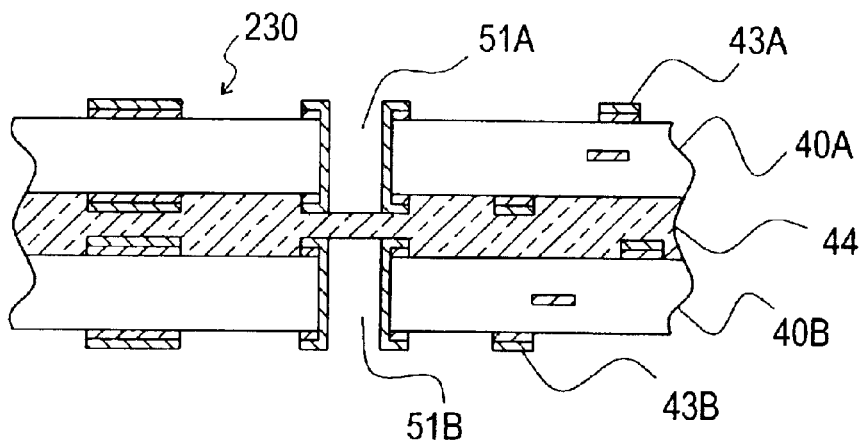
Figure 4C:
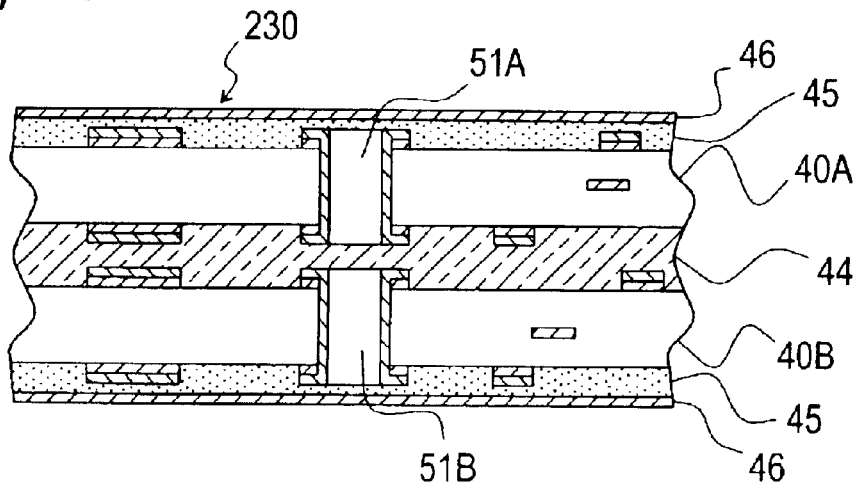
Figure 4D:
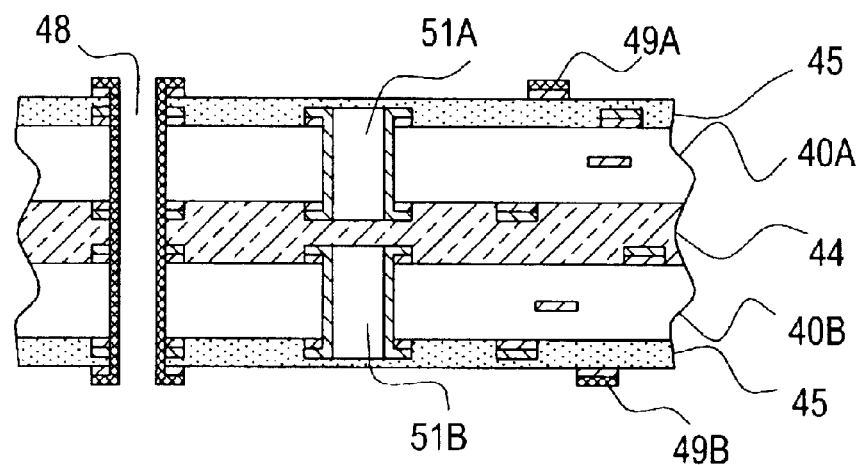

As shown in FIG. 4B, the two copper-clad laminates 40A and 40B are laminated with a prepreg 44 as an insulating adhesive layer, followed by hot-pressing to form a composite laminate 230. In this case, a type of low resin flowability is used for the prepreg 44 so as to prevent incursion of the resin component of the prepreg 44 into the through-holes 41A and 41B by the pressure of hot-pressing process. Accordingly, the through-holes 41A and 41B become non-through holes 51A and 51B each having one end closed by the prepreg 44 serving as an insulation layer. Then, on an upper surface of the upper laminate 40A and an undersurface of the lower laminate 40B, resin films (e.g., polyimide films) 45, 45 having copper foil layer 46, 46 thereon are respectively adhered so as to set copper foil layers 46 outside (FIG. 4C.) Then, as shown in FIG. 4D, a through-hole 48 is bored to penetrate both of the laminates 40A and 40B, and an inner surface of this through-hole is plated with copper. Along this plating process, an upper surface of the upper laminate 40A and an undersurface of the lower laminate 40B are also plated with copper. Then, an etching resist film having predetermined circuit pattern is coated on each of both surfaces of the composite laminate 230, and circuit patterns 49A and 46B of the outer layer conductors are formed by carrying out etching. The through-hole 48 is designed to make the outer layer conductors 49A and 49B conductive to each other.

Figure 4E:
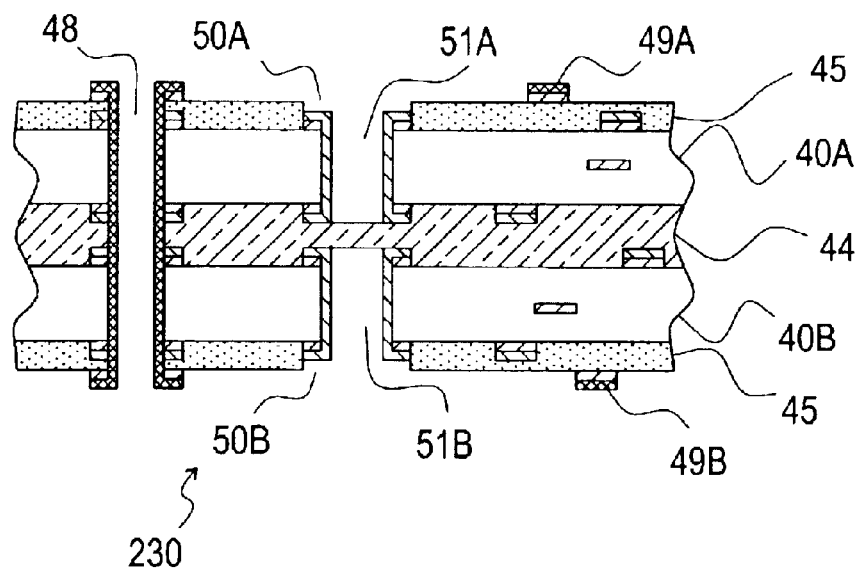

With the above etching process, the copper foil layers 46 are also removed from openings of the through-holes 5141A and 41B by etching, and accordingly the openings are covered with only the polyimide films 45. The polyimide films 45 covering openings 50A and 50B of the through-holes 51A and 51B are removed by laser beam processing. Thus, non-through holes 51A and 51B emerge on the surfaces of the composite laminates 230 (FIG. 4E).

Figure 8:
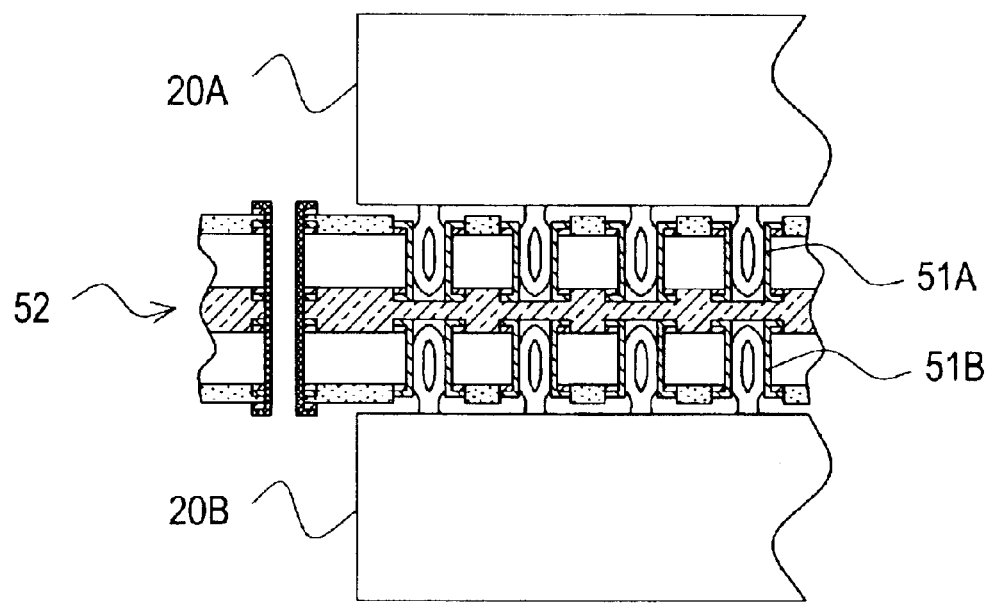
FIG. 8 is a schematic sectional view showing a component mounting mode of the printed wiring mode according to the third embodiment of the invention.

FIG. 8 shows a mode of components mounted on the printed wiring board having the non-through holes formed according to the embodiment. A reference numeral 52 denotes a printed wiring board, and 20A and 20B press-fitting connectors. The press-fitting connectors 20A and 20B are connected to the circuit patterns of the wiring board 52 by press-fitting their leads into the non-through holes 51A and 51B.

Fourth Embodiment

A forth embodiment of a printed wiring board manufacturing method will be described hereinafter with references to FIGS. 5A to 5E, and FIG. 9.

Figure 5A:
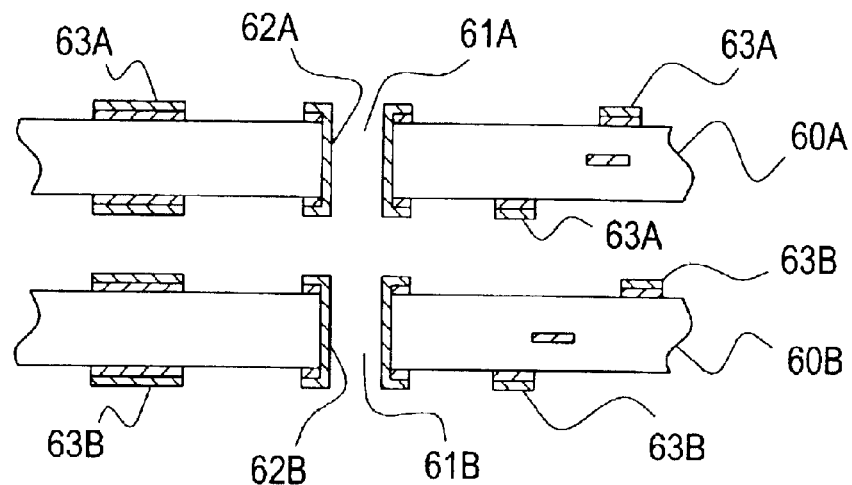
FIGS. 5A to 5E are schematic sectional views, each showing a manufacturing process of a printed wiring board according to a fourth embodiment of the present invention.

As shown in FIG. 5A, double-sided or multilayer copper-clad laminates 60A and 60B are provided, and through-holes 61A and 61B are bored on the same grid thereof. A through-hole diameter is set equal to a diameter (e.g., φ0.5 mm) of a target non-through hole.

Plated layers 62A and 62B are formed on inner wall surfaces of the through-holes 61A and 61B by copper plating. On both upper and lower surfaces of the laminates 60A and 60B, etching resist films having predetermined circuit patterns are coated, and then etching is carried out to form circuit patterns 63A and 63B of the inner layer conductors.

Figure 5B:
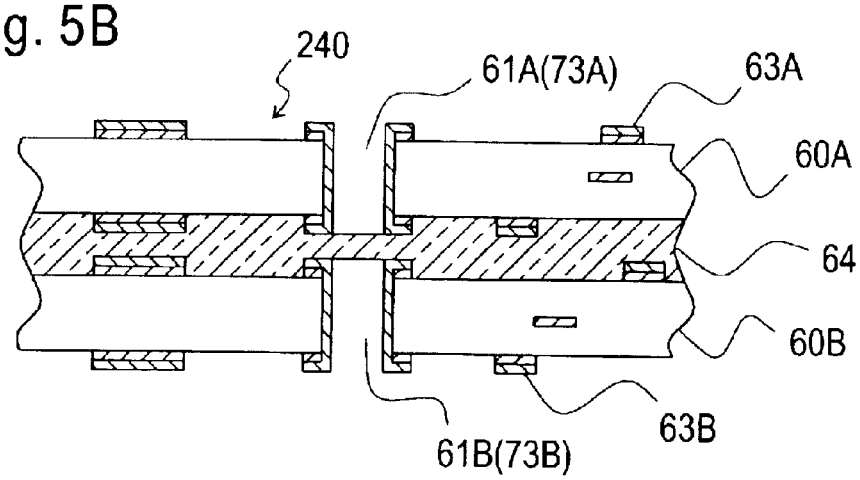

As shown in FIG. 5B, the two copper-clad laminates 60A and 60B are laminated with a prepreg 64 as an insulating adhesive layer, followed by hot-pressing to form a composite laminate 240. In this case, a type of low resin flowability is used for the prepreg 64 so as to prevent incursion of a resin component of the prepreg 64 into through-holes 61A and 61B by hot-pressing. Accordingly, each of the through-holes 61A and 61B has one end closed by the prepreg 64 serving as an insulation layer, and becomes a non-through hole 73A and 73B, respectively.

Figure 5C:
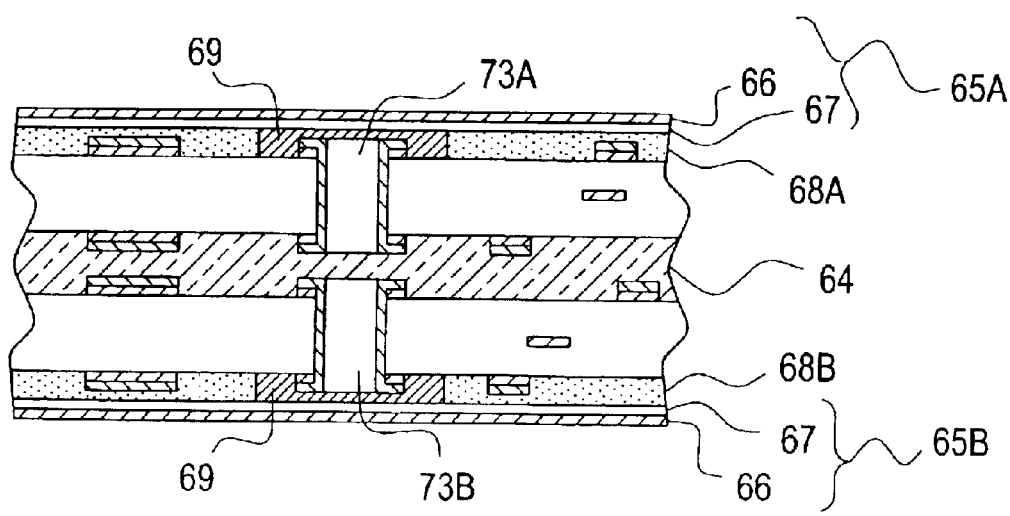

Then, on upper and lower surfaces of the composite r laminate 240, second prepregs 68A and 68B having openings positioned on places of the non-through holes 73A and 73B are laminated. Also for the second prepregs 68A and 68B used here, types of low resin flowability are used. The openings of the non-through holes 73A, 73B not covered with the prepreg 68A, 68B is respectively covered with a heat resistant resin film 69, for example TEFLON (Registered Trademark) film or the like. Then, one-side copper-clad laminates 65A and 65B are laminated on the second prepregs 68A and 68B and the heat resistant film 69 so as to set copper layers 66 outside, followed by hot-pressing (FIG. 5C).

Figure 5D:
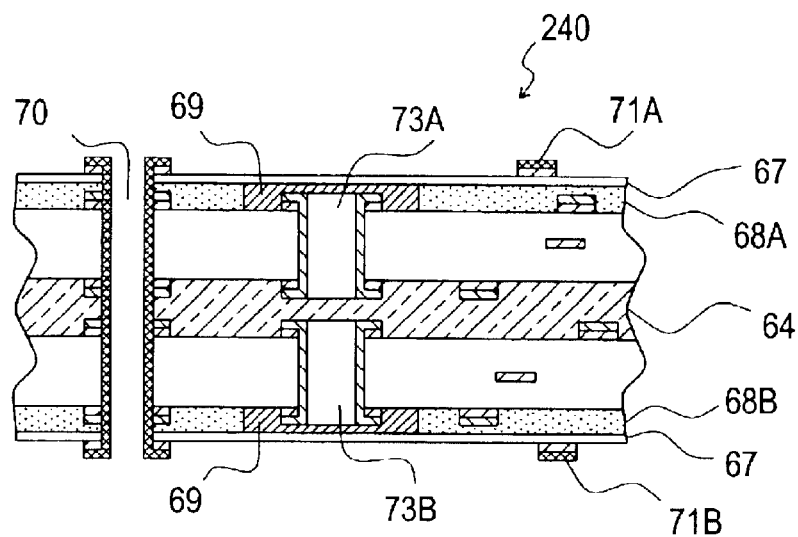
Figure 5E:
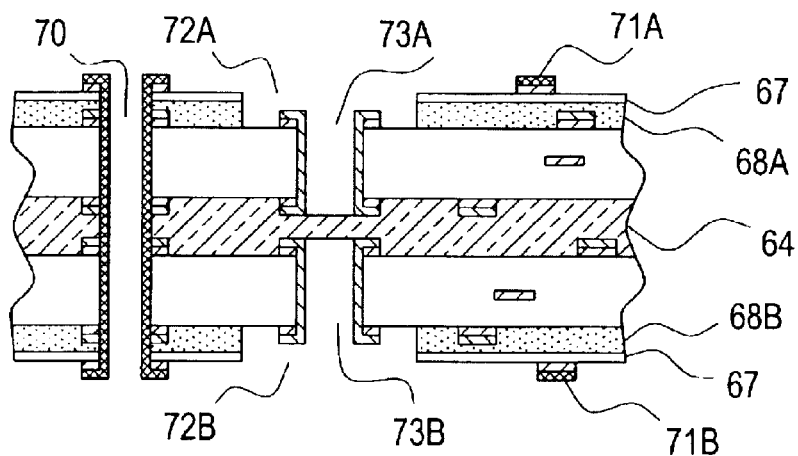

Then, as shown in FIG. 5D, a through-hole 70 is bored to penetrate the composite laminate 240, and an inner surface of this through-hole is plated with copper. In this case, the copper plating is also executed on the copper layers 66 and 66. Then, etching resist films having predetermined circuit pattern are coated on the upper and lower surfaces of the composite laminate 240, and circuit patterns 71A and 71B of the outer payer conductors are formed by carrying out etching. The through-hole 70 is designed to make outer layer conductors 71A and 71B conductive to each other.

Openings 72A and 72B of the non-through holes 73A and 73B from which the copper foils 66 have been removed by etching are accordingly covered with only the heat resistant resin film 69 and base material layers 67 of the one-side copper-clad laminates 65A and 65B. The base material layer 67 is removed by end mill processing to expose the heat resistant resin film 69 outside, and this films 69 are peeled off. Thus, target non-through holes 73A and 73B emerge on the surfaces of the composite laminates 240 (FIG. E).

Figure 9:
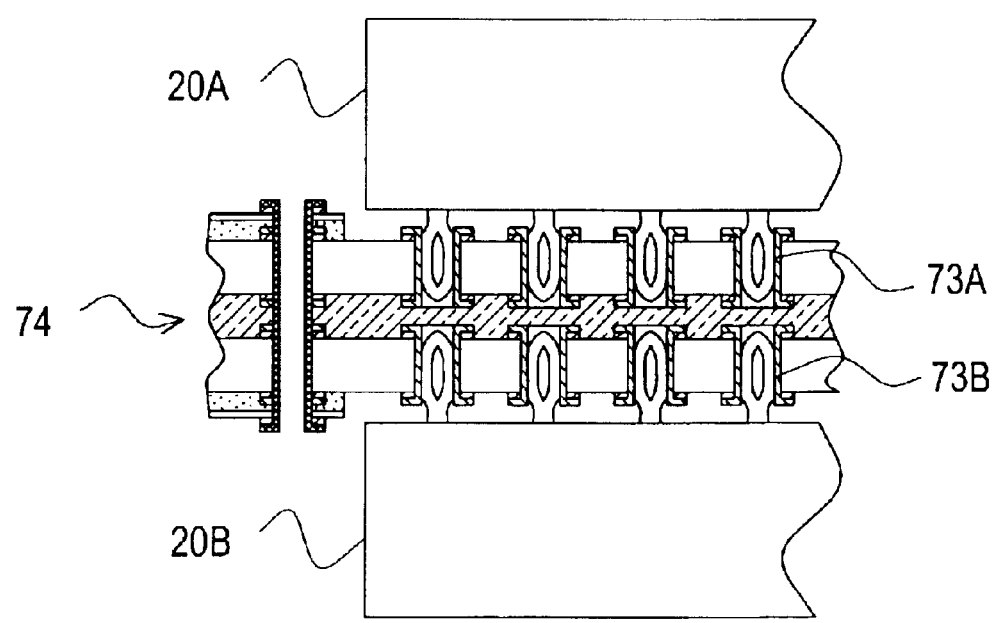
FIG. 9 is a schematic sectional view showing a component mounting mode of the printed wiring board according to the fourth embodiment of the invention.
Figure 10A:
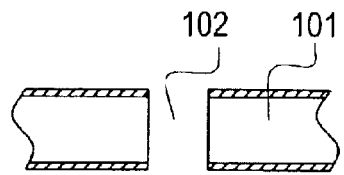
FIGS. 10A to 10F are schematic sectional views, each showing a manufacturing process of a printed wiring board according to a conventional technology.
Figure 10B:
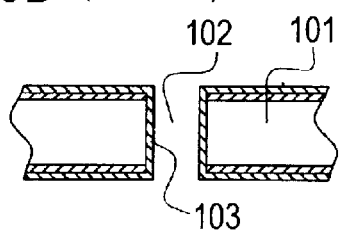
Figure 10C:
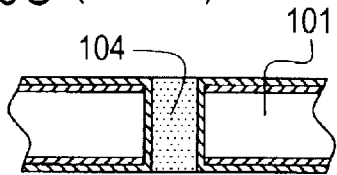
Figure 10D:
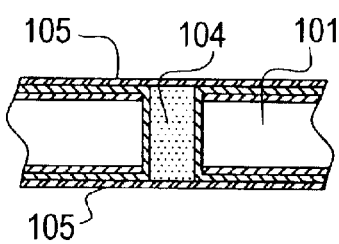
Figure 10E:
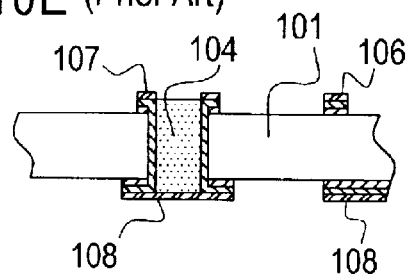
Figure 10F:
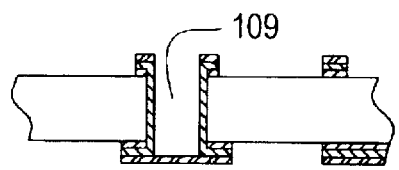
Figure 11:
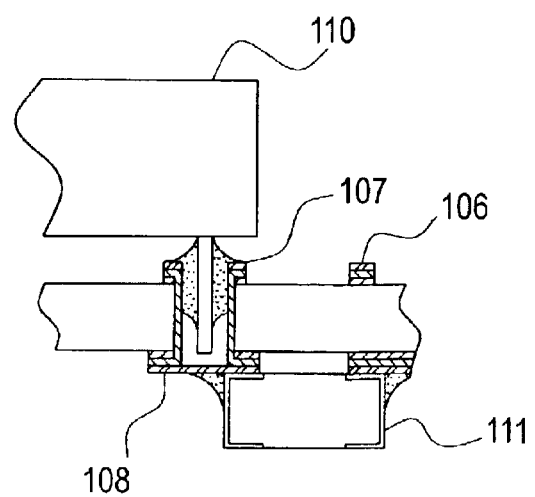
FIG. 11 is a schematic sectional view showing a component mounting mode of the printed wiring board according to the prior art.
Figure 12:
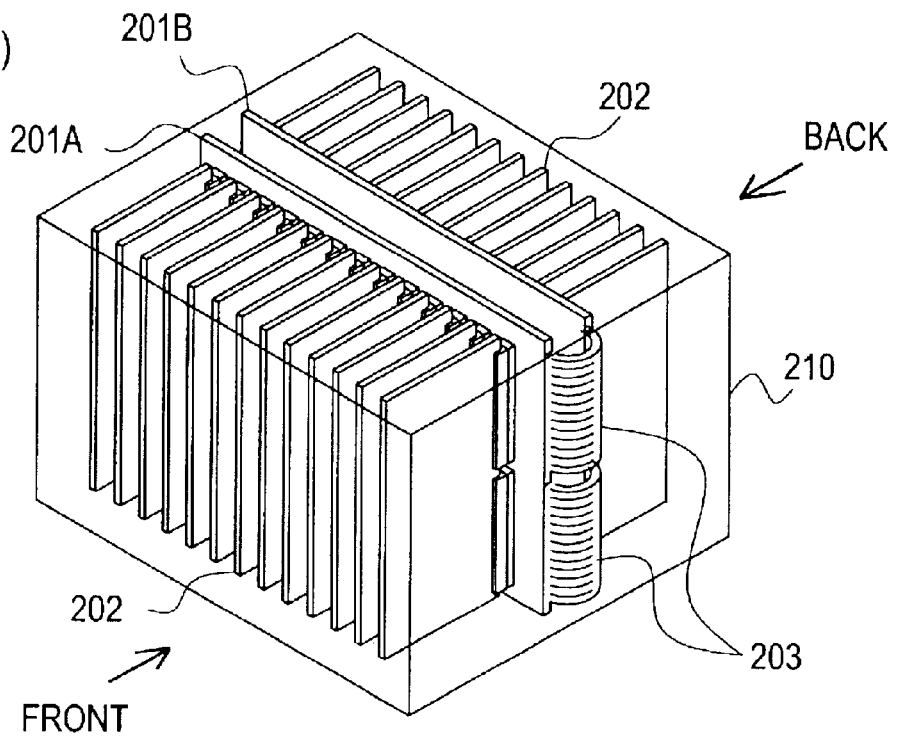
FIG. 12 is a view showing a method of mounting the printed wiring board on a processor according to the prior art.

FIG. 9 shows a mode of components mounted on the printed wiring board having the non-through holes formed according to the embodiment. A reference numeral 74 denotes a printed wiring board, and 20A and 20B press-fitting connectors. The press-fitting connectors 20A and 20B are connected to the circuit patterns of the printed wiring board 74 by press-fitting their leads into the non-through holes 73A and 73B.

In the foregoing four embodiments, the component mounting mode of the printed wiring boards were all based on the mounting of the press-fitting connectors. Needless to say, however, similar operations and advantages can be provided by soldering an insertion component having a lead as a normal soldering component lead in place of the press-fitting connector to the non-through hole. Moreover, the non-through holes opened on both front and back surfaces of the printed wiring board may be positioned on the same grid at least partially. However, such non-through holes may be provided in optional positions other than on the same grid.

As described above, according to the present invention, the non-through holes for lead mounting are formed on both front and back surfaces of the printed wiring board. Accordingly, the insertion component having a lead such as a connector, which has occupied a large mounting area of the printed wiring board, and thus has been a main obstacle to a higher mounting density of components, can be mounted on an optional position of each of the front and back surfaces of the printed wiring board, thereby increasing designing freedom. The components mounted on the front and back surfaces can be mounted on positions of the printed wiring board at least partially overlapped when seen from a vertical direction, or both front and back surface of the same position. With such arrangement, an occupation area of the insertion components can be reduced up to ½, and a great increase can be expected in a component mounting density.

Figure 13:
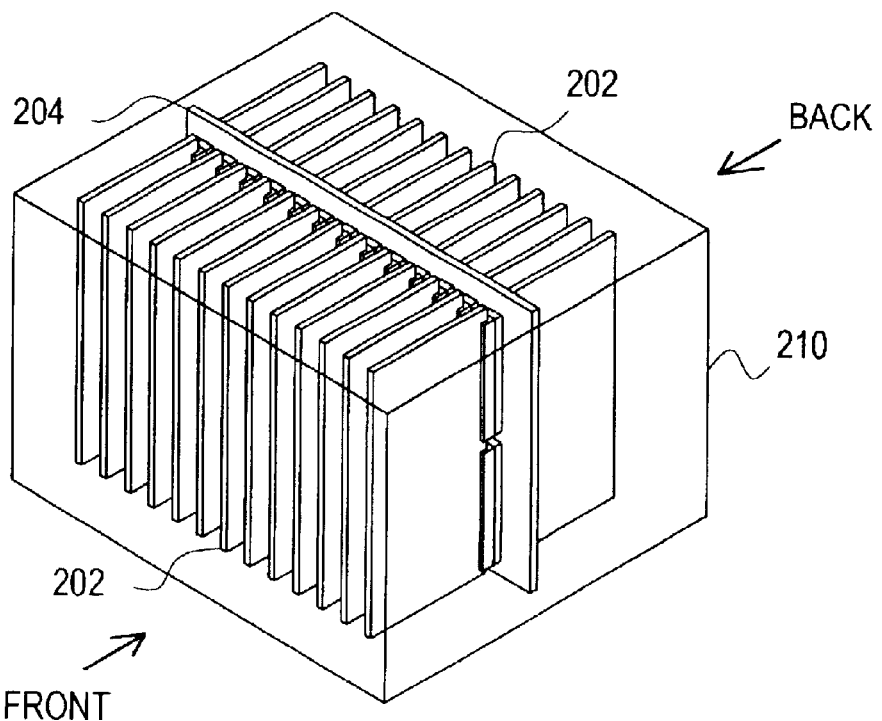
FIG. 13 is a view showing a method of mounting the printed wiring board on a processor according to the present invention.

In addition, in the case of use shown in FIG. 13, a transmission path can be greatly shortened, delay or crosstalk of an electric signal can be reduced in high-speed digital transmission, and an effect of noise from the outside of the processor and transmission of noise to the outside of the processor can be suppressed to a minimum. Thus, it is possible to greatly enhance reliability of the processor.

According to the manufacturing method of the printed wiring board of the present invention, the plated through-holes are formed beforehand on the front (or upper) and back (or lower) copper-clad laminates before lamination. Thus, no plating is necessary for the non-through holes. As a result, it is possible to completely prevent plating failures caused by insufficient entry of plating solution into the holes because of their non-through states, thereby achieving a quality stable manufacturing process.

Furthermore, unlike the case of the non-through hole forming method described above in the background section, the process of filling the through-hole with a resin, and then removing the resin is not executed. Thus, no contact failures caused by resin residuals occur during component mounting.

What is claimed is:

1. A method of manufacturing a printed wiring board enabling insertion components to be mounted on both upper and lower sides thereof, comprising the steps of:

a) providing first and second copper-clad laminates which will make the upper and lower sides of the printed wiring board, respectively, and which is provided with a plated through-hole thereon, respectively;

b) hot-pressing said first and second laminates with each other with a first prepreg as a bonding sheet being sandwiched therebetween to form a first composite laminate; a resin component of the first prepreg having low flowability so that the respective through-holes are closed by the prepreg to form respective non-through holes;

c) laminating a second prepreg, a resin component of the second prepreg having low flowability, on each of upper and lower surfaces of said first composite laminate, to form a second composite laminate, the second prepreg having an opening corresponding to each of the non-through holes;

d) covering the respective non-through holes exposed on the upper and lower surfaces of said second composite laminate with heat resistant resin films to form a third composite laminate;

e) laminating a one-side copper-clad laminate, having a base material layer and a copper layer thereon, on each of upper and lower surfaces of the third composite laminate while disposing the copper layer outside, followed by hot-pressing;

f) etching each of the one-side copper-clad laminates to form outer layer circuit patterns, and to remove the copper layers positioned on the non-through holes to expose the base material layers;

g) removing the base material layers covering the openings of the non-through holes by end mill processing, to expose the heat resistant resin film outside; and h) removing the heat resistant resin films from the non-through holes, so that the non-through holes can be used for mounting of the insertion components from both upper and lower side of the printed wiring board.

2. The method according to claim 1, wherein the non-through holes on the upper and lower sides of the printed wiring board are disposed in a manner that insertion components mounted on the upper and lower sides are overlapped with each other at least partially when seen from a direction vertical to the printed wiring board.

3. The method according to claim 1, wherein the non-through holes opened on the upper and lower sides of the printed wiring board are positioned at least partially on a grid of the printed wiring board.

* * * * *